US010873148B2

(12) United States Patent
Murakami et al.

(10) Patent No.: US 10,873,148 B2
(45) Date of Patent: Dec. 22, 2020

(54) CONNECTOR, CONNECTOR ASSEMBLY, AND CIRCUIT DEVICE

(71) Applicant: Molex, LLC, Lisle, IL (US)

(72) Inventors: Koji Murakami, Yamato (JP);
Yukihisa Uchikawa, Yamato (JP);
Takahiro Akaike, Yamato (JP); Teruki Nagase, Yamato (JP)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 16/402,235

(22) Filed: May 3, 2019

(65) Prior Publication Data

US 2019/0356077 A1   Nov. 21, 2019

(30) Foreign Application Priority Data

May 18, 2018   (JP) .................. 2018-096301

(51) Int. Cl.
| | |
|---|---|
| *H01R 13/405* | (2006.01) |
| *H01R 13/50* | (2006.01) |
| *H01R 12/71* | (2011.01) |
| *H01R 13/10* | (2006.01) |
| *H01R 13/627* | (2006.01) |

(52) U.S. Cl.
CPC ........... *H01R 13/50* (2013.01); *H01R 12/716* (2013.01); *H01R 13/10* (2013.01); *H01R 13/405* (2013.01); *H01R 13/6272* (2013.01)

(58) Field of Classification Search
CPC .. H01R 12/716; H01R 12/724; H01R 13/405; H01R 13/73
USPC .......................................................... 439/78
See application file for complete search history.

(56) References Cited

U.S. PATENT DOCUMENTS

| | | | | |
|---|---|---|---|---|
| 6,022,244 A | * | 2/2000 | Chiu ................... | H01R 12/707 439/570 |
| 6,328,600 B1 | * | 12/2001 | Fujiki ................... | H01R 12/57 439/570 |
| 8,177,581 B2 | * | 5/2012 | Zeng .................. | H01R 12/7052 439/567 |
| 8,226,422 B2 | * | 7/2012 | Towashiraporn ...... | H01R 13/41 439/83 |

(Continued)

FOREIGN PATENT DOCUMENTS

| | | |
|---|---|---|
| CN | 101136520 A | 3/2008 |
| CN | 201975591 U | 9/2011 |

(Continued)

OTHER PUBLICATIONS

First Office Action and Search Report received for CN application No. 201910414597.7, dated Jul. 22, 2020, 15 pages. (8 pages of English translation and 7 pages of official copy).

*Primary Examiner* — Hien D Vu

(57) ABSTRACT

A first terminal includes a to-be-held portion configured to be inserted, in a vertical direction, into a terminal holding hole. The outer surface of the to-be-held portion and the inner surface of the terminal holding hole formed in the first housing include: a contact region where the outer surface of the to-be-held portion and the inner surface of the terminal holding hole are in contact with each other; and a gap region where a reservoir space is formed between the outer surface of the to-be-held portion and the inner surface of the terminal holding hole. The contact region includes a partial region located on an exposed portion's side.

15 Claims, 11 Drawing Sheets

(56) References Cited

U.S. PATENT DOCUMENTS

| | | | |
|---|---|---|---|
| 10,411,377 B2 * | 9/2019 | Kawahara | H01R 12/707 |
| 2017/0110828 A1 * | 4/2017 | Nagase | H01R 12/75 |

FOREIGN PATENT DOCUMENTS

| | | |
|---|---|---|
| CN | 102044794 B | 12/2012 |
| CN | 207038781 U | 2/2018 |
| CN | 207381635 U | 5/2018 |
| JP | 1991-058877 U | 6/1991 |
| JP | 1997-063696 A | 3/1997 |
| JP | 1997-106852 A | 4/1997 |
| JP | H11-168274 A | 6/1999 |
| JP | 5956298 B2 | 7/2016 |
| TW | 201711290 A | 3/2017 |
| WO | 2014/099405 A1 | 6/2014 |

\* cited by examiner

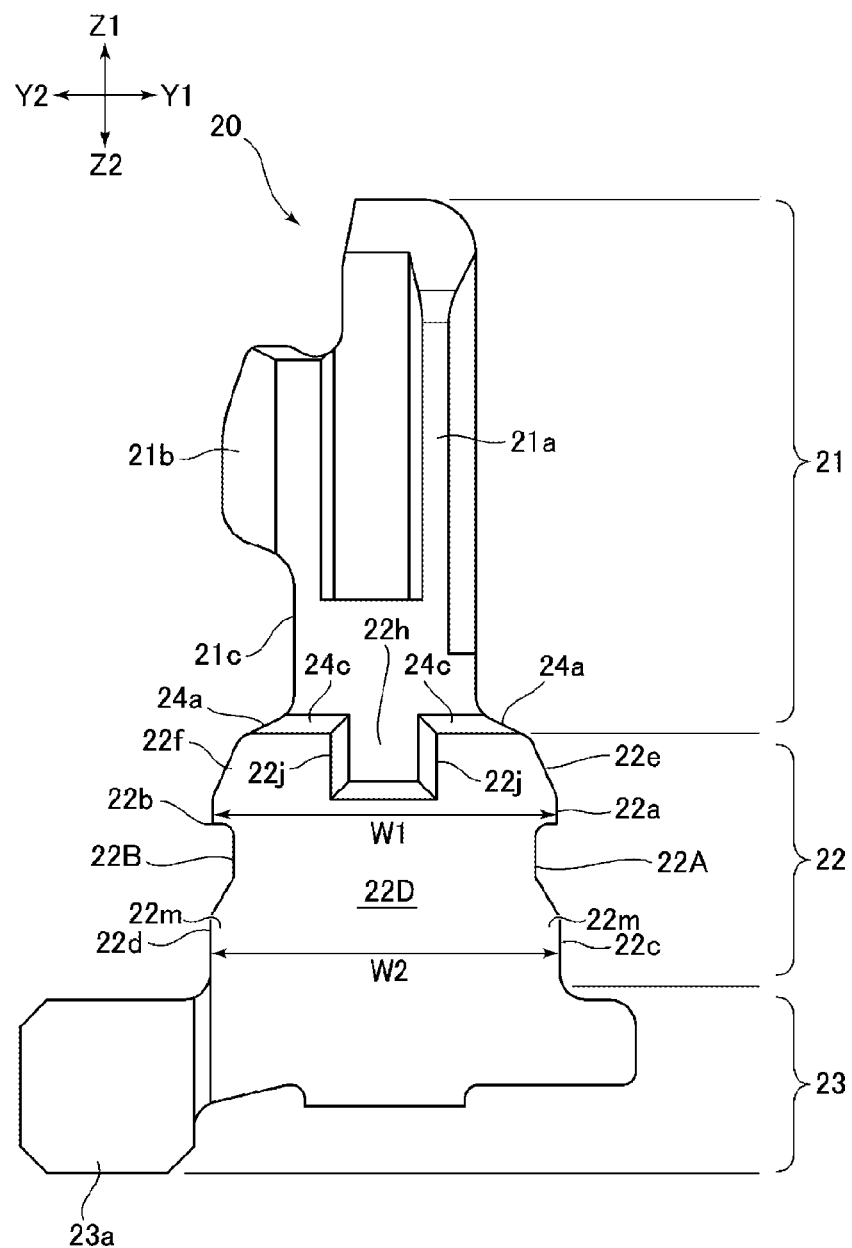

CONNECTOR, CONNECTOR ASSEMBLY, AND CIRCUIT DEVICE

RELATED APPLICATIONS

This application claims priority to Japanese Application No, 2018-096301, filed on May 18, 2018, which application is incorporated herein by reference in its entirety.

TECHNICAL FIELD

The present disclosure relates to a connector, a connector assembly, and a circuit device.

BACKGROUND ART

For the purpose of preventing dust, moisture, and the like of a circuit board, a surface of a circuit board is sometimes covered with a resin potting material (see, for example, Patent Document 1). In the manufacturing process of the circuit board, the liquid potting material is applied to the surface of the circuit board, and then cured, for example, at room temperature or in a thermostatic bath.

Patent Document 1: Japanese Unexamined Patent Application Publication No. 11-168274

SUMMARY

Some circuit boards have connectors mounted thereon. In a case where a liquid potting material supplied on a surface of such a circuit board enters an unintended area in the housing of the connector, the entry of the liquid potting material may have an undesirable effect on the electrical connection between the connector and the counterpart connector.

An exemplar connector proposed in the present disclosure includes: a housing in which a terminal holding hole is formed as a hole penetrating in a first direction, and a terminal disposed in the terminal holding hole. The terminal includes: a to-be-held portion positioned in the terminal holding hole and held inside the terminal holding hole; a first portion sticking out from the terminal holding hole and including a contact point configured to contact a counterpart terminal; and a second portion sticking out from the terminal holding hole on a side opposite to the first portion and including a to-be-attached portion configured to be attached to a circuit board. An outer surface of the to-be-held portion and an inner surface of the terminal holding hole include: a contact region where the outer surface of the to-be-held portion and the inner surface of the terminal holding hole are in contact with each other; and a gap region where a space is formed between the outer surface of the to-be-held portion and the inner surface of the terminal holding hole. The contact region includes a first partial region located on the second portion side, in the first direction, of the gap region. According to this connector, it is possible to suppress the infiltration of the potting material into the housing of the connector. Note that in the present specification, a term "contact region" does not necessarily mean a complete contact. To put it differently, in a case where a connector has a region that is not fully in contact due to tolerances or the like reasons, such a connector is also within the scope of the connector proposed in the present disclosure.

BRIEF DESCRIPTION OF DRAWINGS

FIG. 4B is a side elevation view illustrating a left side of the first terminal.

DETAILED DESCRIPTION OF THE PREFERRED EMBODIMENTS

Hereinafter, embodiments of a connector, a connector assembly, and a circuit device proposed by the present disclosure will be described. When in use, the connector proposed in the present disclosure is mounted on a circuit board. The connector may be utilized for connecting a circuit board with a wire, or may be utilized for connecting two circuit boards with each other. The present disclosure will describe, as illustrative examples, a connector 10, a connector assembly 1, and a circuit device including the connector 10. The circuit device includes the connector 10, a circuit board M (see FIG. 7), and a potting material N (see FIG. 7). The connector 10 and the connector assembly 1 are used for connecting the circuit board M and a cable 91.

In the following description, the directions Z1 and Z2 are referred to as the upward and the downward directions, respectively; the directions Y1 and Y2 are referred to as the forward and the rearward directions, respectively; and the directions X1 and X2 are referred to as the rightward and the leftward directions. These directions are used to describe the relative positional relationships among members and portions included in the connector, and do not limit the orientations of the connector and the connector assembly when the connector and the connector assembly are used.

Figure 1:
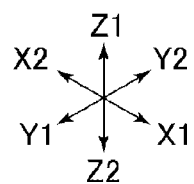
FIG. 1 is a perspective view illustrating an exemplar connector assembly proposed by the present disclosure.
Figure 1:
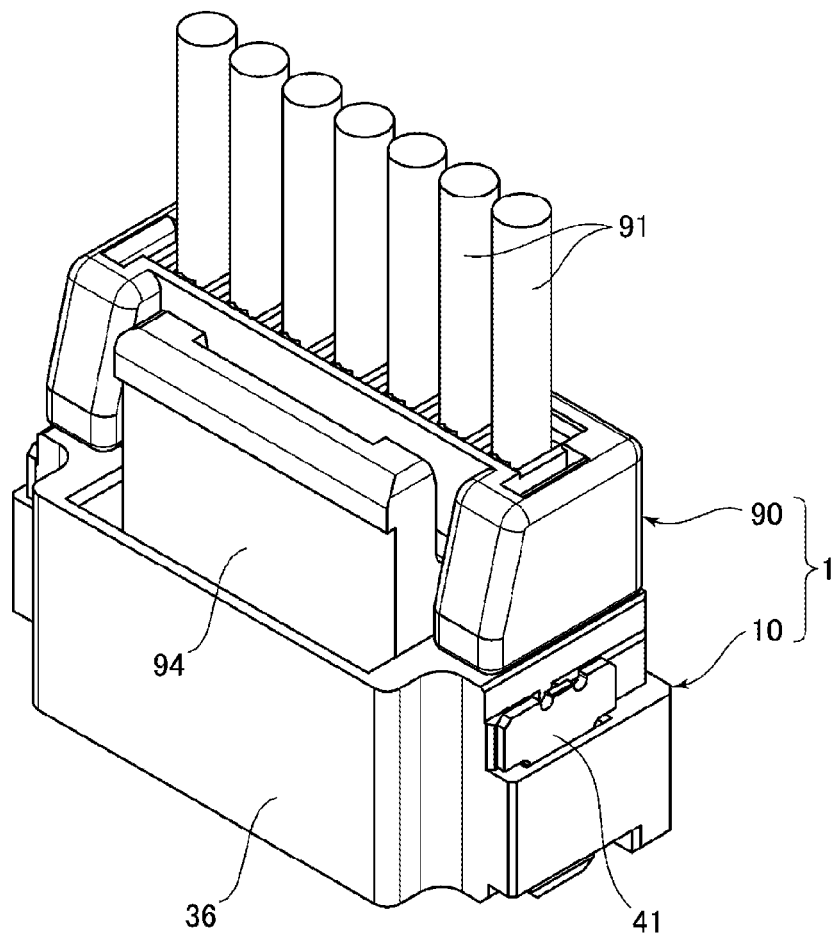

As illustrated in FIG. 1, the connector assembly 1 includes a first connector 10 and a second connector 90 that is capable of being mated with the first connector 10. When used, the first connector 10 is mounted, for example, on the circuit board M (see FIG. 7). The first connector 10 and the second connector 90 are capable of being mated with each other in a vertical direction, that is, in a direction orthogonal to the circuit board M on which the first connector 10 is mounted. The mating direction of the connectors proposed in the present disclosure is not limited to the vertical direction. For example, the structure of the present disclosure may be applied to a connector that can be mated in a horizontal direction, i.e., a connector that can be mated in a direction parallel to the circuit board. As another example, the structure of the present disclosure may be applied to a connector to which a flat plate-shaped conductive path such as a Flexible Printed Circuit (FPC) board, a Flexible Flat Cable (FFC), or the like can be connected.

Figure 2:
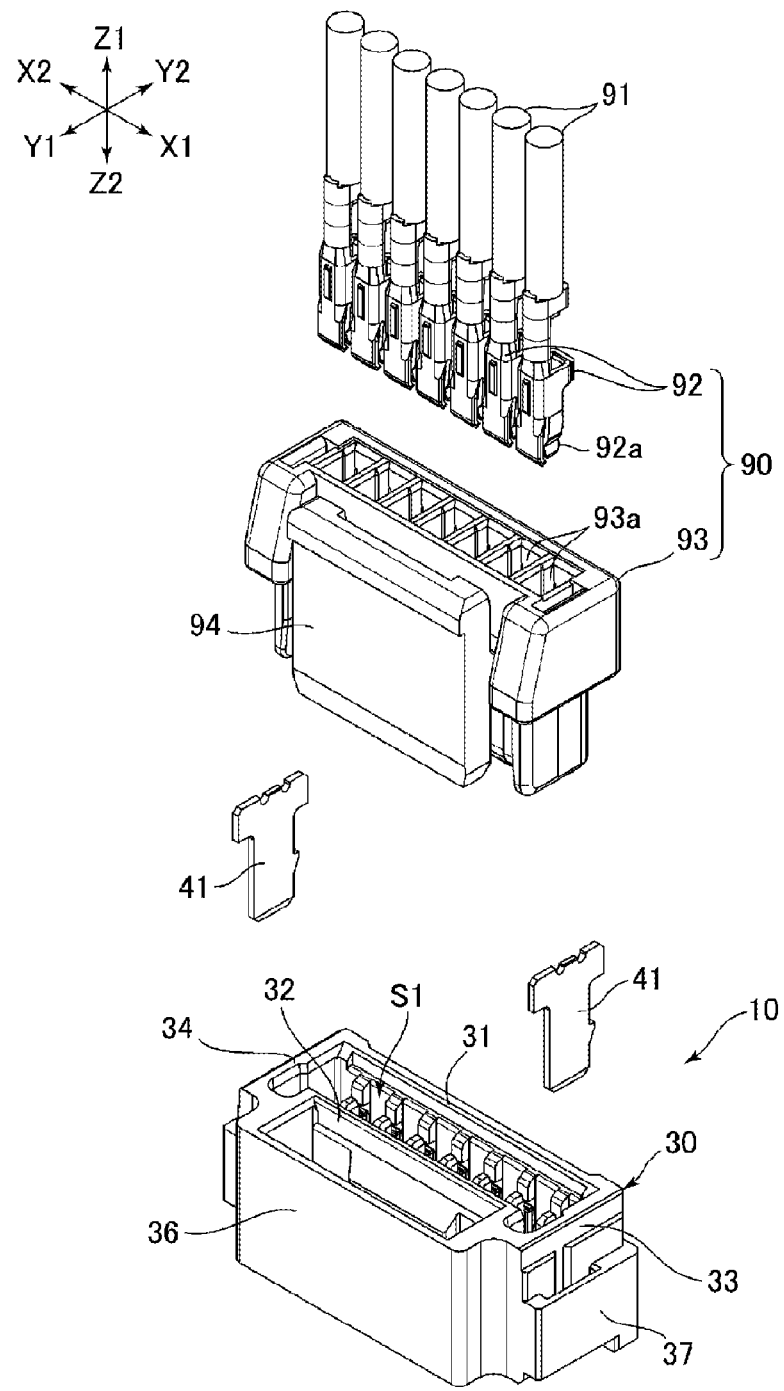
FIG. 2 is an exploded perspective view illustrating an exemplar connector (first connector) proposed by the present disclosure.
Figure 3:
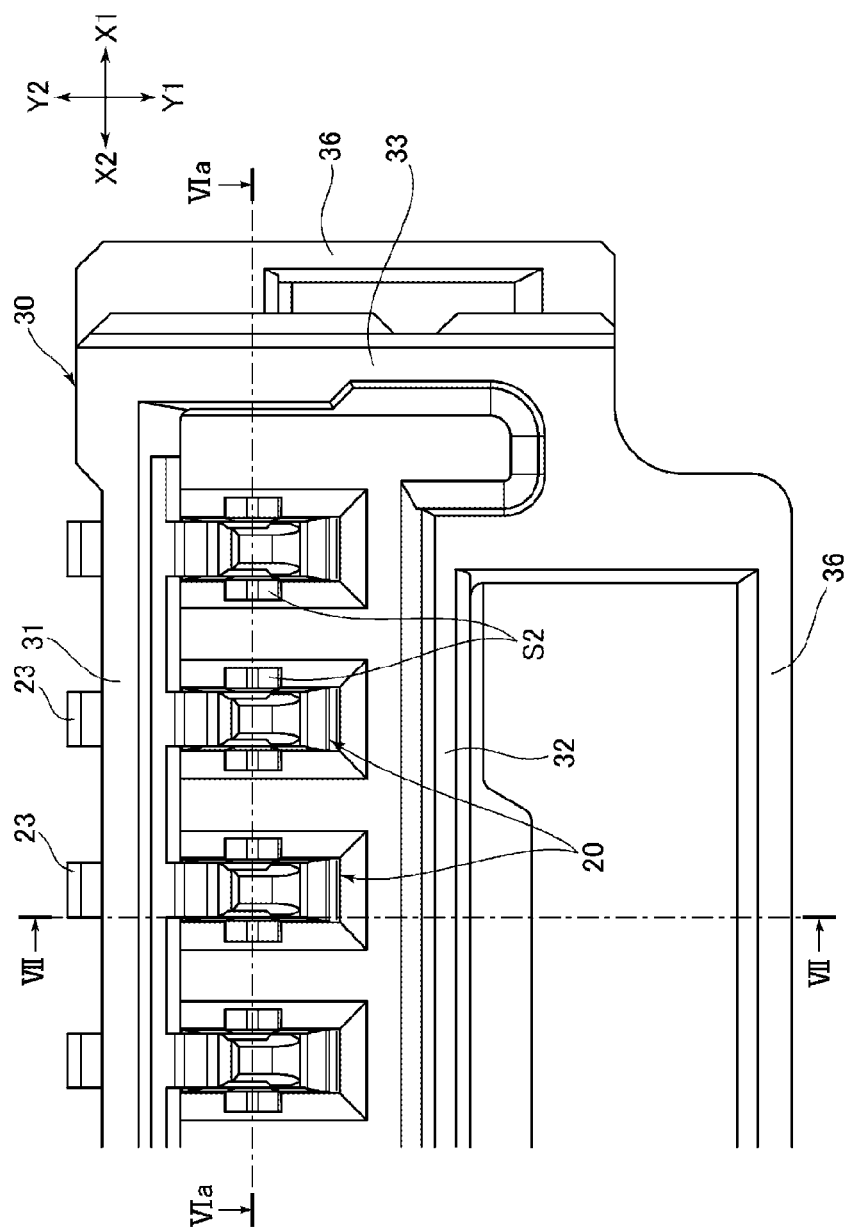
FIG. 3 is a plan view of the connector (first connector).

As illustrated in FIG. 2, the second connector 90 includes: a plurality of terminals 92 that are attached to the ends of the plurality of cables 91 on a one-to-one basis; and a housing 93 configured to hold the terminals 92. Note that in the present disclosure, the cable 91 and the terminal 92 are crimped together. Selecting another connection method such as pressure welding and soldering is allowable as long as the selected method can achieve electrical connection between the cable 91 and the terminal 92. Hereinafter, the terminal 92 is referred to as a "second terminal", and the housing 93 is referred to as a "second housing." A plurality of terminal holes 93a into which, for example, the plurality of second terminals 92 are inserted is formed in the second housing 93. The plurality of terminal holes 93a are aligned in the left-and-right direction in a single row. The second housing 93 is made from resin. The structure of the second connector 90 is not limited to the example illustrated in FIG. 2. For example, the plurality of second terminals 92 may be arranged in a plurality of rows (for example, two rows or three rows) in the left-and-right direction and in the front-to-rear direction. It is, however, possible to provide only one second terminal 92.

The first connector 10 includes: a plurality of terminals 20 (see FIG. 6A); and a housing 30 that holds the terminals 20. Hereinafter, the terminals 20 are referred to as "first terminals", and the housing 30 is referred to as a "first housing." In the example of the first connector 10, the plurality of first terminals 20 are arranged in the left-and-right direction in a single row as in the case of the second terminals 92. The plurality of first terminals 20 may be arranged in a plurality of rows (for example, two rows or three rows) in the left-and-right direction and in the front-to-rear direction. It is, however, possible to provide only one first terminal 20. At least, the number of and the arrangement of the plurality of first terminals 20 of the first connector may be the number and the arrangement that allow the plurality of first terminals 20 to be connected to the plurality of second terminals 92 of the second connector. Like the second housing 93, the first housing 30 is formed from a resin.

Each of the first terminals 20 is formed, for example, by punching and bending from a metal plate (e.g., copper sheet). In addition, to prevent the potting material (described later) from infiltrating into the inside of the first housing 30, the surface of the first housing 30 may be coated with a fluorine-based coating agent, for example.

Figure 4A:
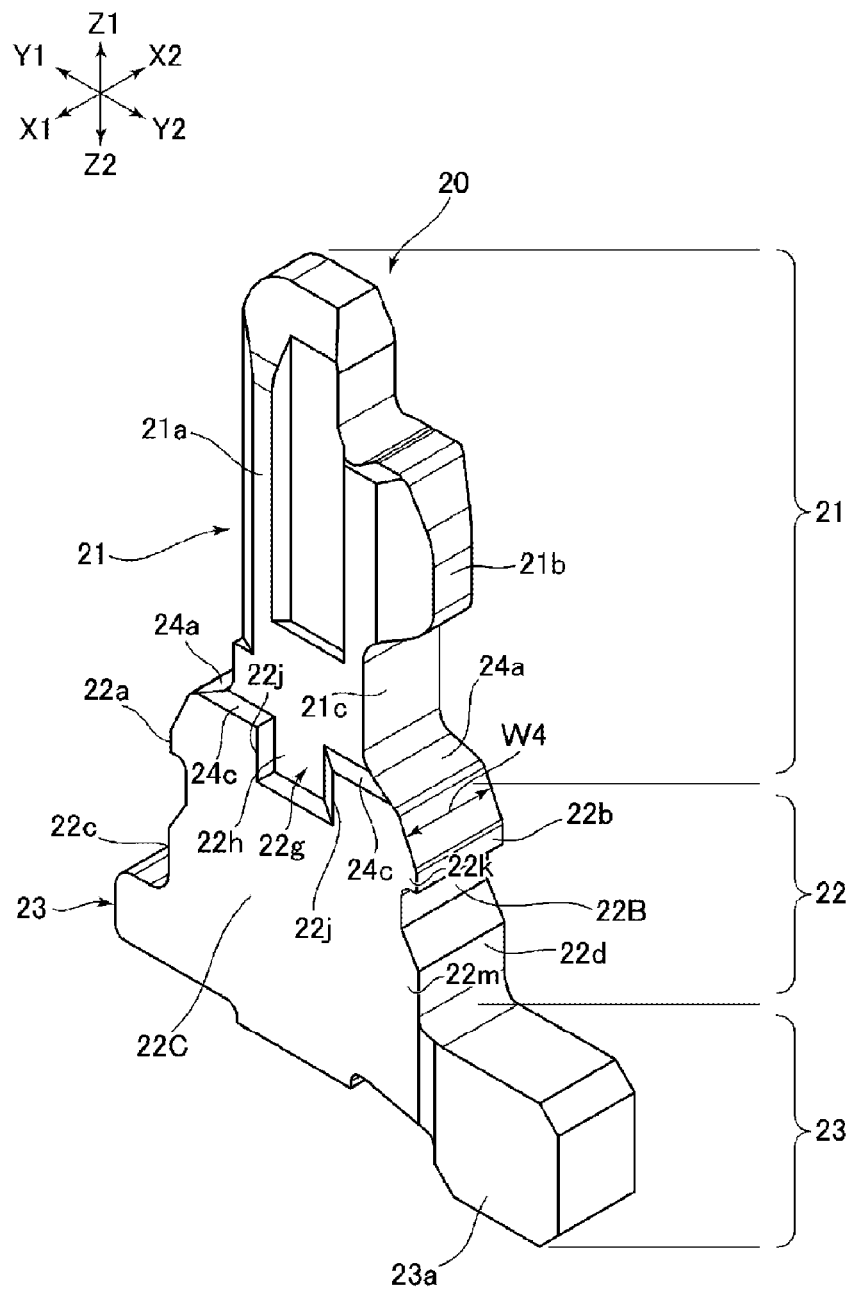
FIG. 4A is a perspective view illustrating a terminal (first terminal) included in a connector.

The first housing 30 includes a plurality of terminal holding holes 35a (see FIG. 5A), which are aligned in the left-and-right direction and which pass through the first housing 30. As illustrated in FIG. 6A and FIG. 4A, each of the first terminals 20 includes a portion that is inserted into the corresponding terminal holding hole 35a and that is to be held within the terminal holding hole 35a (hereinafter, that portion will be referred to as a "to-be-held portion 22.") The to-be-held portion 22 includes engaging portions (anchors) 22a and 22b, each of which is configured to be hooked on the inner surface of the corresponding terminal holding hole 35a. In addition, each of the first terminals 20 includes a mating portion 21 that protrudes out from the terminal holding hole 35a; and an exposed portion 23 that protrudes out from the terminal holding hole 35a on the opposite side to the mating portion 21. The mating portion 21 includes contact points 21a, one of which is on the right-hand side and the other one of which is on the left-hand side of the mating portion 21. Each contact point 21a is configured to be in contact with the corresponding one of contact points 92a of the second terminal 92 (see FIG. 2). As illustrated in FIG. 2 and FIG. 7, for example, the description of the first connector 10 and the second connector 90 is based on an example where: two flat-plate-shaped contact points 92a are provided so as to face each other; the mating portion 21 having one contact point 21a on the right-hand side and another contact point 21a on the left-hand side has a flat-plate shape, and is configured to be inserted between and held from both sides by the two contact points 92a, achieving electrical connection between the contact points 21a and 92a. The exposed portion 23 includes a portion that is configured to be attached to the circuit board M (the portion will be referred to as a to-be-attached portion 23a). In the example of the first connector 10, the mating portion 21 corresponds to the upper portion of the first terminal 20, whereas the exposed portion 23 corresponds to the bottom portion of the first terminal 20.

Figure 5A:
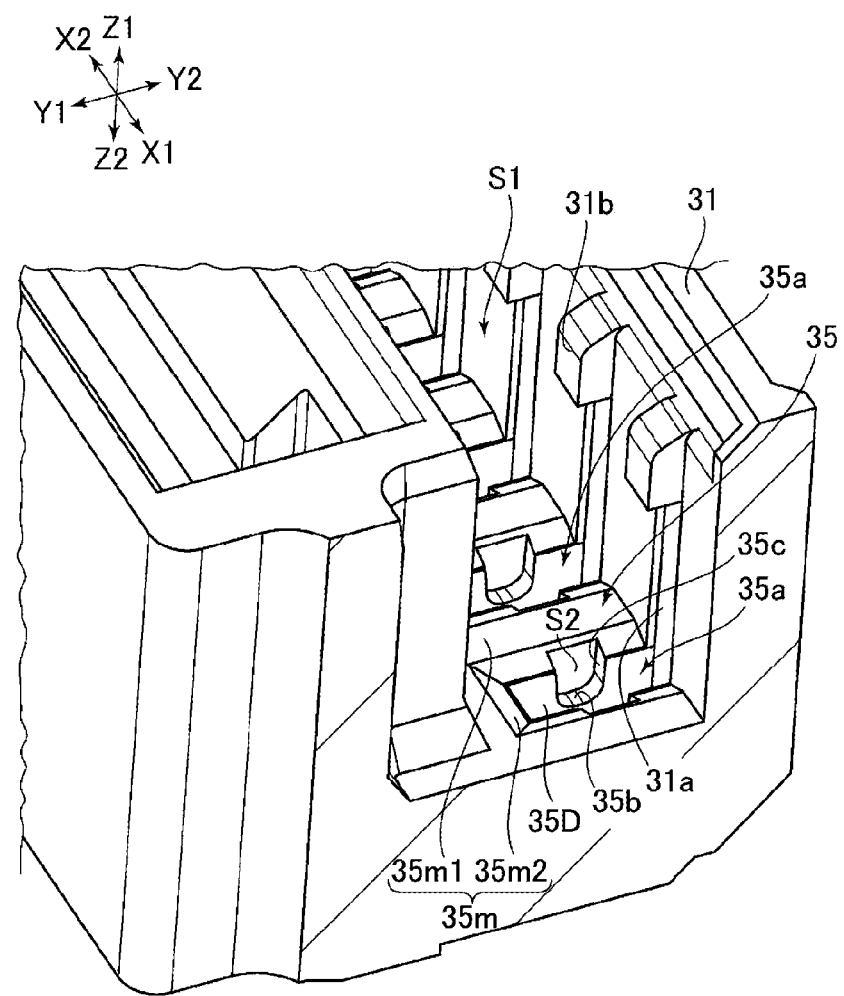
FIG. 5A is a perspective view illustrating a cross section of a housing (first housing) included in the connector.
Figure 6A:
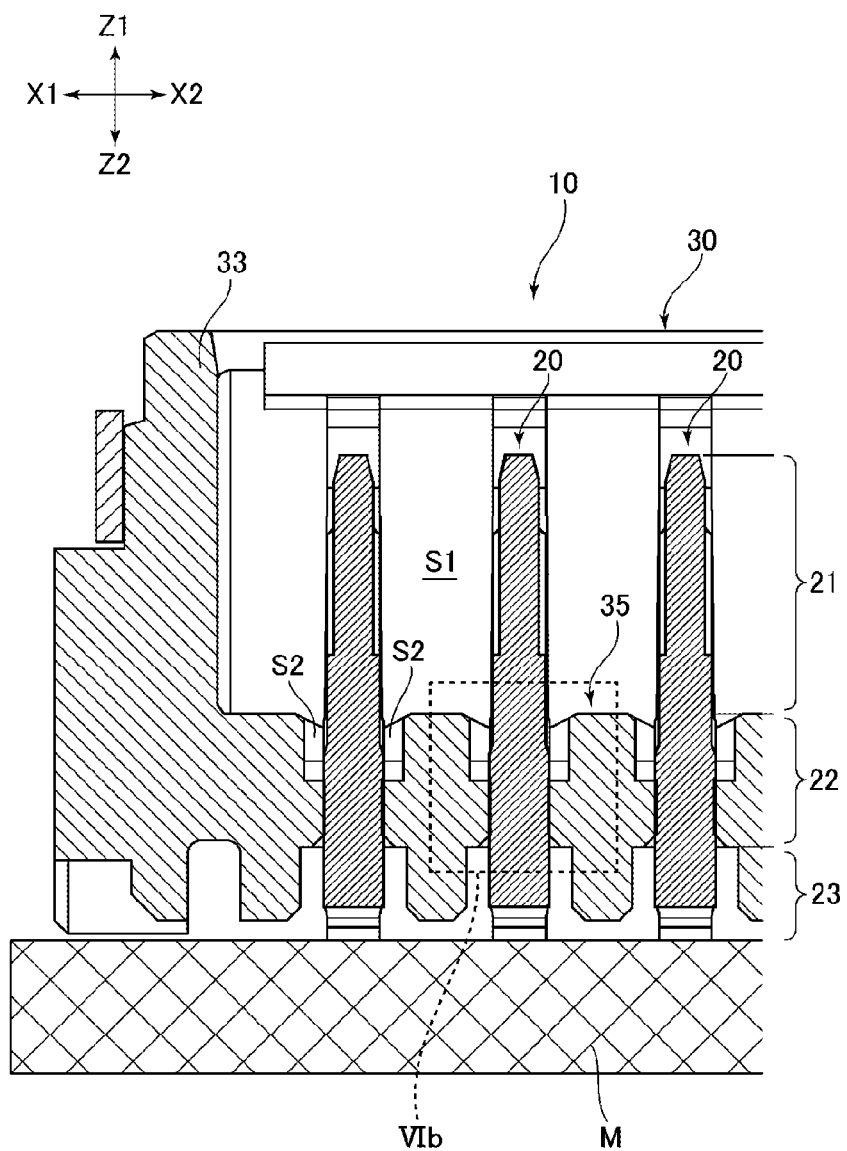
FIG. 6A is a cross-sectional view taken along the line VIa-VIa indicated in FIG. 3.
Figure 7:
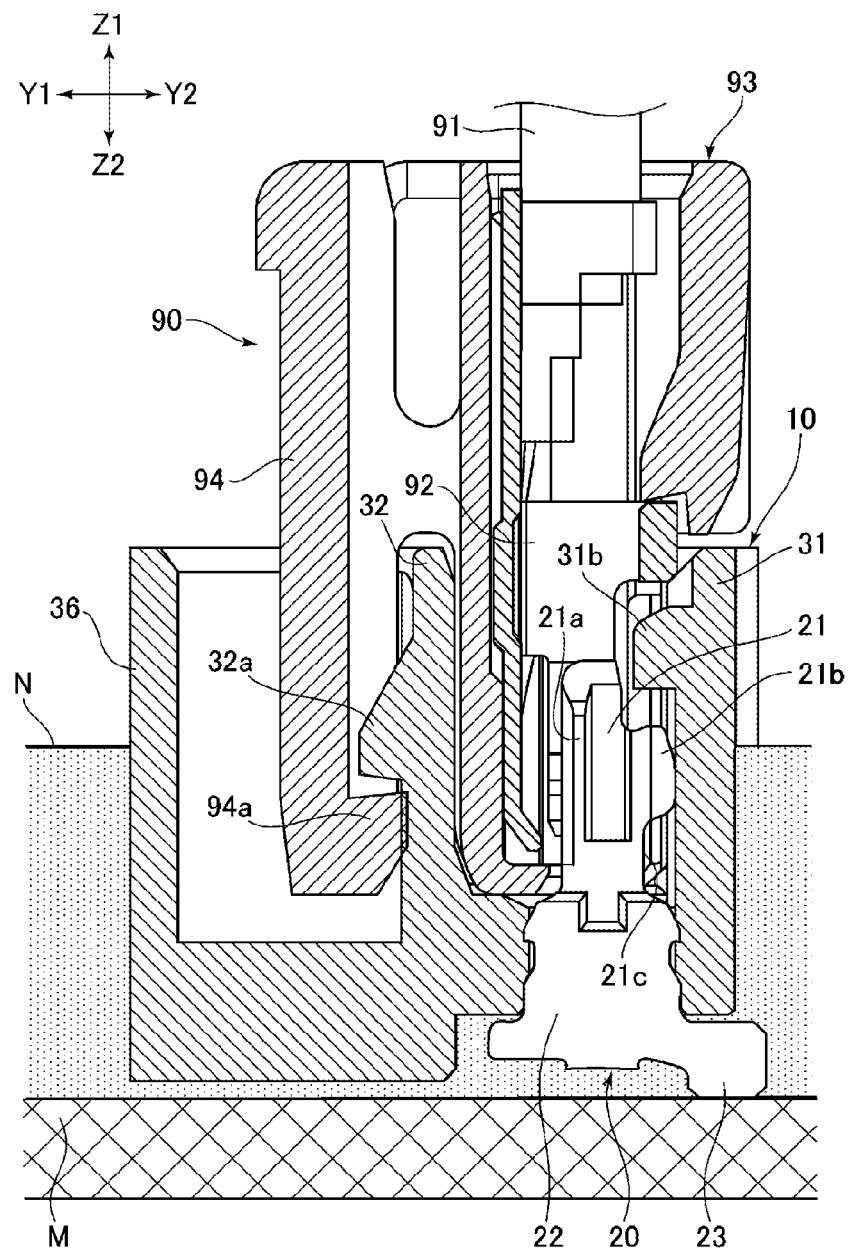
FIG. 7 is a cross-sectional view taken along the line VII-VII indicated in FIG. 3. This figure illustrates a state where the two connectors illustrated in FIG. 1 are mated together.

As illustrated in FIGS. 5A and 6A, the first housing 30 includes a mating space S1 that opens toward the second connector 90. The mating portion 21 of the first terminal 20 is positioned in the mating space S1. In the example of the first connector 10, the mating portions 21 of the plurality of first terminals 20 are positioned in one mating space S1. Unlike the example of the first connector 10, a plurality of mating spaces may be formed for the plurality of mating portions 21 on a one-to-one basis. As illustrated in FIG. 2, in the example of the first connector 10, the first housing 30 has a rear wall 31, a front wall 32, a right wall 33, and a left wall 34. The mating space S1 is defined by the walls 31, 32, 33, and 34. The first housing 30 has a bottom portion 35 (see FIG. 6A), which is the bottom of the mating space S1. The structure of the walls 31, 32, 33, and 34 defining the mating space S1 is not limited to the example illustrated in FIG. 2 and in other figures.

Figure 5B:
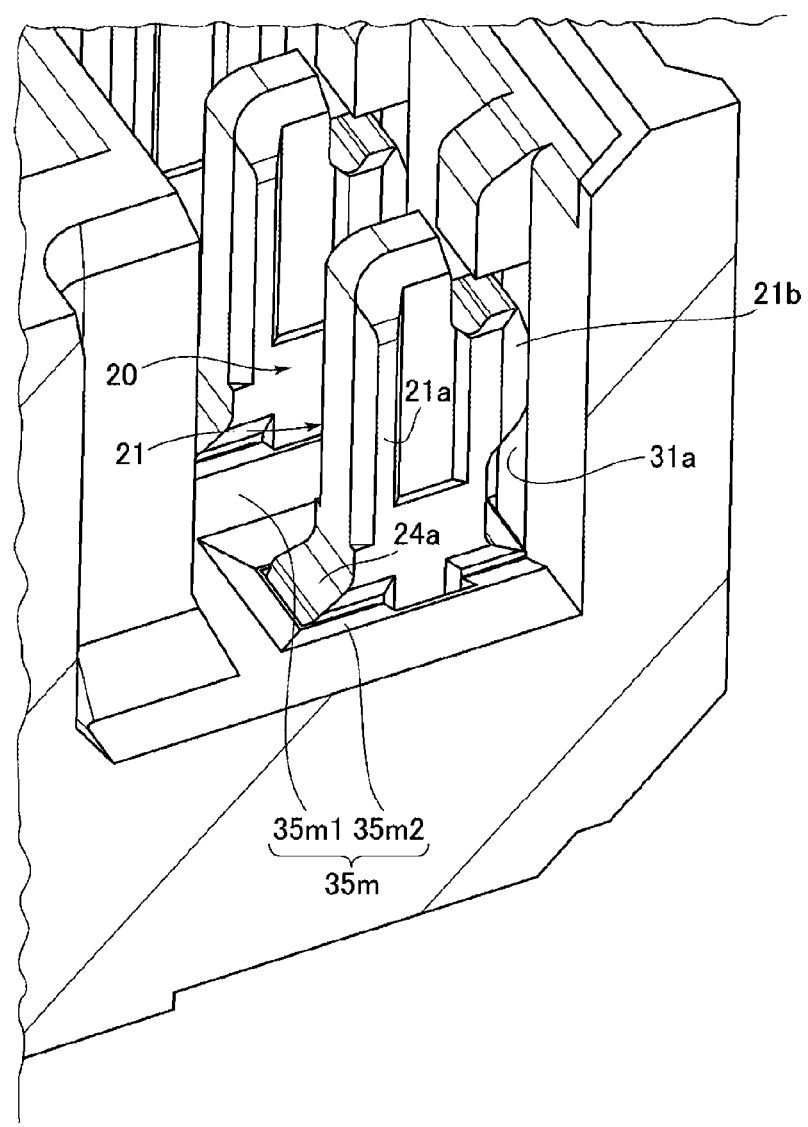
FIG. 5B is a perspective view illustrating a cross section of the housing (first housing) included in the connector. This figure illustrates a state where the first terminal is inserted in the housing.

The bottom portion 35 includes the plurality of terminal holding holes 35a (see FIGS. 5A and 5B) described earlier. Each of the plurality of terminal holding holes 35a is configured to accept the insertion of the corresponding first terminal 20. Each mating portion 21 extends upward from the bottom portion 35. The bottom portion 35 corresponds to the "terminal holding portion" in the claims. When the connectors 10 and 90 are mated together as illustrated in FIG. 7, each second terminal 92 of the second connector 90 enters the mating space S1 (see FIG. 2) and contacts the contact points 21a of the corresponding mating portion 21. As illustrated in FIG. 4A and FIG. 4B, in the example of the first connector 10, the contact points 21a are raised portions that are formed on the right-hand side surface and on the left-hand side surface—one on each surface—of the mating portion 21. Each of the contact points 21a is formed along the vertical direction. When the connectors 10 and 90 are mated together, each mating portion 21 is held from both sides by the contact points 92a of the corresponding second terminal 92 of the second connector 90, and each of the contact point 21a comes into contact with the corresponding terminal 92a. The shape of the mating portion 21 and the shape of the contact point 21a are not limited to those in the example of the first connector 10.

As illustrated in FIGS. 5A and 6A, in the example of the first connector 10, the terminal holding holes 35a penetrate the bottom portion 35 in the vertical direction. Each of the plurality of first terminals 20 is inserted into the corresponding one of the plurality of terminal holding holes 35a, and the to-be-held portion 22 is held inside the terminal holding hole 35a. To put it differently, the to-be-held portion 22 is press fit in the terminal holding hole 35a, and the engaging portions 22a and 22b of the to-be-held portion 22 are hooked on the inner surface of the terminal holding holes 35a. Thus, the to-be-held portion 22 is fixed to the inside of the terminal holding hole 35a. The direction in which the first terminal 20 is attached to the first housing 30 is not limited to the direction in the example of the first connector 10. The first terminal 20 may be attached to the first housing 30 in the front-to-rear direction, for example. In this case, a terminal holding hole may be formed to penetrate a wall (either the front wall or the rear wall) of the first housing 30 in the front-to-rear direction.

Figure 8:
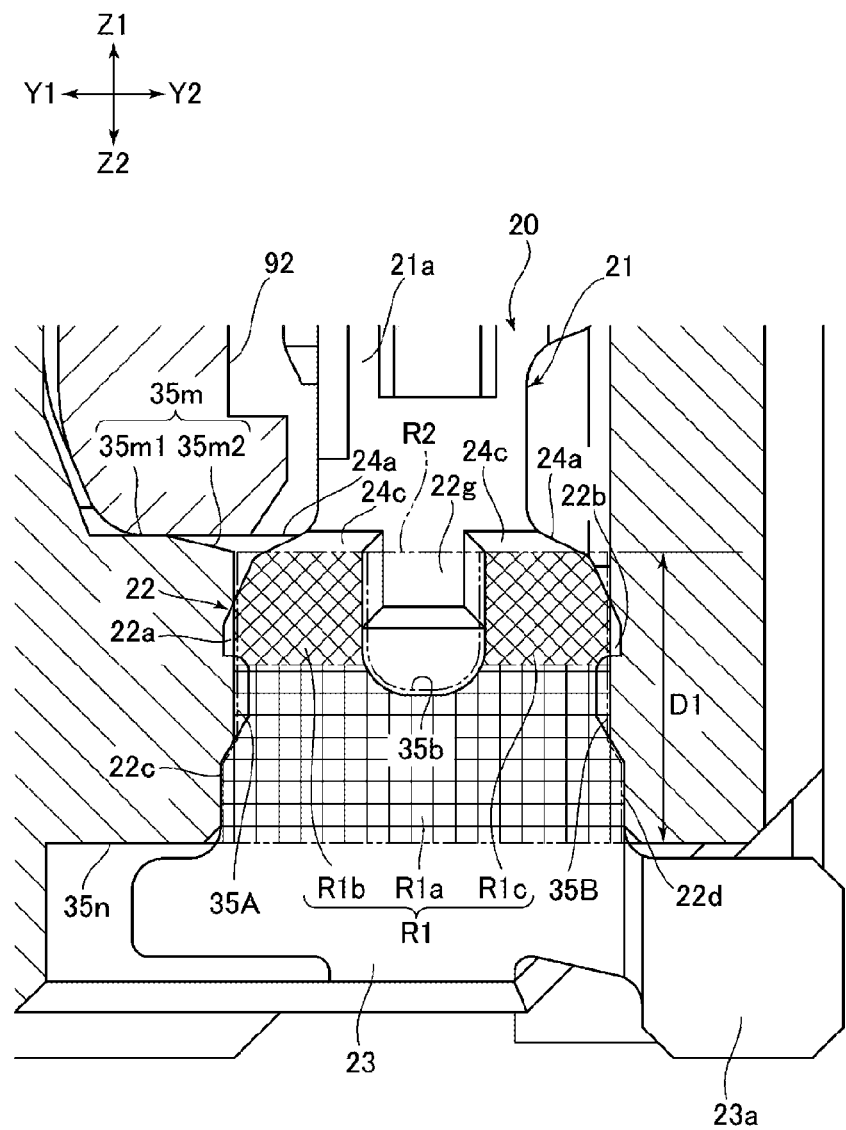
FIG. 8 is an enlarged view illustrating a part of FIG. 7.

Note that, as illustrated in FIG. 8, the to-be-held portion 22 is a portion corresponding to the depth D1 of the terminal holding hole 35a. To put it differently, the to-be-held portion 22 is a portion corresponding to the length from a top surface 35m to a bottom surface 35n of the bottom portion 35. The aforementioned mating portion 21 is an exposed portion that sticks out upward from the terminal holding hole 35a. To put it differently, the engaging portion 21 is a portion located at a higher position than the top surface 35m of the bottom portion 35. The above-described exposed portion 23 is an exposed portion that sticks out downward from the terminal holding hole 35a. To put it differently, the exposed portion 23 is a portion located at a lower position than the bottom surface 35n of the bottom portion 35. In the example of the first connector 10, the exposed portion 23 includes the to-be-attached portion 23a located at a lower end of the rear side of the exposed portion 23 and configured to be attached to the circuit board M.

As illustrated in FIG. 4A and FIG. 4B, the to-be-held portion 22 has the following outer surfaces: a front surface 22A facing forward; a rear surface 22B facing rearward; a right side surface 22C facing rightward; and a left side surface 22D facing leftward. The inner surface of the terminal holding hole 35a includes: a front inner surface 35A (see FIG. 8), an rear inner surface 35B (see FIG. 8), a right inner surface 35C (see FIG. 6B), and a left inner surface 35D (see FIG. 6B) facing, respectively, the front surface 22A, the rear surface 22B, the right side surface 22C, and the left side surface 22D of the to-be-held portion 22.

As illustrated in FIG. 4A, FIG. 4B, and FIG. 8, in the example of the first connector 10, the engaging portion 22a is formed on the front surface 22A. The engaging portion 22a is configured to be hooked on the inner surface (specifically, the front inner surface 35A) of the terminal holding hole 35a. In addition, an engaging portion 22b is formed on the rear surface 22B. The engaging portion 22b is configured to be hooked on the inner surface (specifically, the rear inner surface 35B) of the terminal holding hole 35a. The engaging portion 22a is formed to protrude forward from the front surface 22A whereas the engaging portion 22b is formed to protrude rearward from the rear surface 22B. Each of the engaging portions 22a and 22b has a corner configured to be hooked on the inner surface of the terminal holding hole 35a. The distance W1 between the engaging portions 22a and 22b measured in the front-to-rear direction (see FIG. 4B) is slightly greater than the width of the terminal holding hole 35a measured in the front-rear direction. Hence, when the to-be-held portion 22 is inserted into the terminal holding hole 35a, the corners of the engaging portions 22a and 22b are hooked on the inner surface of the terminal holding hole 35a, and thus prevent the to-be-held portion 22 from coming out of the terminal holding hole 35a by restricting the movement in such a direction. The shape of each of the engaging portions 22a and 22b is not limited to that illustrated in FIGS. 4A and 4B. The shape may be any shape as long as the shape can restrict the movement of the first terminal 20 in the direction that allows the first terminal 20 to come out of the terminal holding hole 35a.

As illustrated in FIG. 4A and FIG. 4B, the front surface 22A of the to-be-held portion 22 includes a contact portion 22c. The contact portion 22c is positioned so as to be separated downward from the engaging portion 22a. To put it differently, the contact portion 22c is positioned between the exposed portion 23 and the engaging portion 22a, and a recess is formed between the engaging portion 22a and the contact portion 22c. The contact portion 22c protrudes forward, and the front surface of the contact portion 22c is configured to be in contact with the inner surface of the terminal holding hole 35a (see FIG. 8).

As illustrated in FIG. 7, a potting material N of resin is applied to the surface of the circuit board M on which the first connector 10 is mounted. In the manufacturing process of an electronic device equipped with the circuit board M, the lower portion of the first connector 10 is soaked in the liquid potting material N. As described above, the engaging portion 22a and the contact portion 22c are formed on the front surface 22A. With this configuration, it is possible to effectively prevent the potting material N from passing through the gap between the front surface 22A of the to-be-held portion 22 and the inner surface of the terminal holding hole 35a and thus entering the mating space S1. For example, even in a case where the potting material N has passed through the gap between the contact portion 22c and the terminal holding hole 35a, the potting material N remains in the recess between the contact portion 22c and the engaging portion 22a. Hence, it is possible to prevent the potting material N from entering the mating space S1. As will be described later, it is preferable that the contact portion 22c be press-fit in the terminal holding hole 35a and be in close contact with or simply in contact with the inner surface of the terminal holding hole 35a.

As illustrated in FIGS. 4A and 4B, the rear surface 22B includes a contact portion 22d that is separated downward from the engaging portion 22b as in the case of the front surface 22A. To put it differently, the contact portion 22d is positioned between the exposed portion 23 and the engaging portion 22b, and a recess is formed between the engaging portion 22b and the contact portion 22d. The contact portion 22d protrudes rearward, and the rear surface of the contact portion 22d is configured to be in contact with the inner surface of the terminal holding hole 35a (see FIG. 8). With this configuration, like the effect described earlier, it is possible to effectively prevent the potting material N from passing through the gap between the rear surface 22B of the to-be-held portion 22 and the inner surface of the terminal holding hole 35a and thus entering the mating space S1.

In the example of the first connector 10, each of the contact portions 22c and 22d has a greater protruding amount than each of the engaging portions 22a and 22b has. To put it differently, the distance W2 between the surfaces of the contact portions 22c and 22d (see FIG. 4B) is greater than the distance W1 between the ends of the engaging portions 22a and 22b. As a result, the surfaces of the contact portions 22c and 22d contact, respectively, the front inner surface 35A and the rear inner surface 35B of the terminal holding hole 35a. The protruding amount of each of the contact portions 22c and 22d may be equal to the protruding amount of the engagement portions 22a and 22b.

As illustrated in FIG. 4A, the width W4, measured in the left-and-right direction, of the engaging portion 22b formed on the rear surface 22B of the first terminal 20 is constant (i.e., not decreasing toward the rear side). Likewise, the width, measured in the left-and-right direction, of the contact portion 22*d* is also constant (i.e., not decreasing toward the rear side). Hence, the inner surface of the terminal holding hole 35*a* is in close contact with the side surfaces 22*k* (both the right side surface and the left side surface) of the engaging portion 22*b* and the side surfaces 22*m* (both the right side surface and the left side surface) of the contact portion 22*d*. Accordingly, the potting material N is also prevented from passing through the gaps located on the right-hand side and on the left-hand side of the engaging portion 22*b* or through the gaps located on the right-hand side and on the left-hand side of the contact portion 22*d*. As in the case of the engaging portion 22*b* and the contact portion 22*d* on the rear side, the width, measured in the left-and-right direction, of the engaging portion 22*a* formed on the front surface 22A and the width, measured in the left-and-right direction, of the contact portion 22*c* are also constant (i.e., not decreasing toward the front side). Hence, the potting material N is also prevented from passing through the gaps located on the right-hand side and on the left-hand side of the engaging portion 22*a* or through the gaps located on the right-hand side and on the left-hand side of the contact portion 22*c*.

Note that a configuration that is different from the example of the first connector 10 is also possible. Specifically, the engaging portion and the contact portion have to be formed on only one of the front surface 22A and the rear surface 22B of the to-be-held portion 22, and the other one of these surfaces 22A and 22B may be devoid of such portions. In this case, the surface on which neither the engaging portion nor the contact portion is formed may be a flat surface that is configured to be in contact with the inner surface of the terminal holding hole 35*a*. In addition, the front surface 22A and the rear surface 22B may only have the engaging portions 22*a* and 22*b*, respectively. To put it differently, the front surface 22A and the rear surface 22B do not have to have the contact portions 22*c* and 22*d*, respectively. In addition, two or more engaging portions 22*a* may be formed on the front surface 22A. Likewise, two or more engaging portions 22*b* may be formed on the rear surface 22B. In addition, two or more contact portions 22*c* may be formed on the front surface 22A. Likewise, two or more contact portions 22*d* may be formed on the rear surface 22B.

In the example of the first connector 10, the right side surface 22C and the left side surface 22D of the to-be-held portion 22 are in contact with the inner surface of the terminal holding holes 35*a*. In a state where the first terminal 20 is not in the terminal holding hole 35*a*, the distance between the right side surface 22C and the left side surface 22D (i.e., the thickness of the to-be-held portion 22) is slightly greater than the distance between the right inner surface 35C and the left inner surface 35D of the terminal holding hole 35*a* (i.e., the width of the terminal holding hole 35*a* measured in the left-and-right direction). Hence, the right side surface 22C and the left side surface 22D of the to-be-held portion 22 can be brought into close contact with the inner surface of the terminal holding hole 35*a*.

Figure 6B:
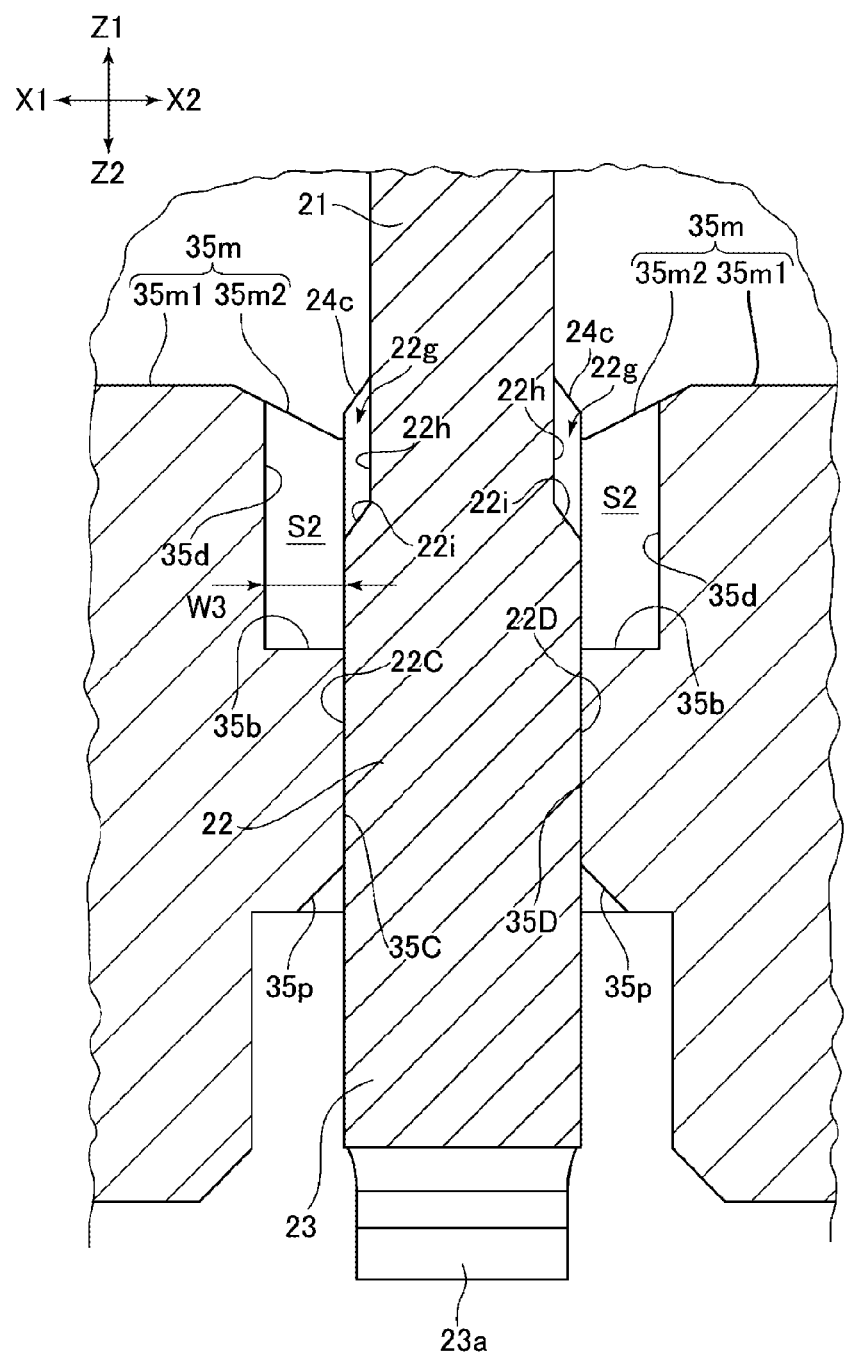
FIG. 6B is an enlarged view illustrating the area VIb indicated in FIG. 6A.

As illustrated in FIG. 6B, a space S2 is formed between a portion of the right inner surface 35C of the terminal holding hole 35*a* and a portion of the right side surface 22C of the to-be-held portion 22. To put it differently, the right side surface 22C and the right inner surface 35C have a region R2 (see FIG. 8) where the right side surface 22C and the right inner surface 35C are separated from each other. The space S2 is formed in the region R2. Hereinafter, the region R2 is referred to as a "gap region." Space S2 is also referred to as "reservoir space." In the example of the first connector 10, a recess is formed in the right inner surface 35C of the terminal holding hole 35*a*, and the recess is used for securing the reservoir space S2. In addition, in the example of the first connector 10, a recess 22*g* (see FIG. 6B) is also formed in the outer surface of the to-be-held portion 22 of the first terminal 20, and this recess 22*g* also serves as a reservoir space S2.

As illustrated in FIG. 6B, the right inner surface 35C of the terminal holding hole 35*a* includes a reservoir surface 35*b*. The reservoir surface 35*b* includes a portion that is located at a lower position (on the exposed portion 23 side) of the reservoir space S2 and that serves as the bottom of the reservoir space S2. To put it differently, the right side surface 22C and the right inner surface 35C have a region R1 (see FIG. 8) where the right side surface 22C and the right inner surface 35C are in contact with each other, and the reservoir surface 35*b* is formed between the gap region R2 and the region R1. In the example of the first connector 10, the reservoir surface 35*b* includes an upward facing surface, a forward facing surface, and a rearward facing surface. The reservoir surface 35*b* may be an inclined surface or a horizontal surface.

Hereinafter, the region R1 is referred to as a "contact region." Note that there may be a case where the surface(s) of the insulating-resin formed member(s) and the surface(s) of the metal plate(s) are not perfectly flat surfaces, and where these surfaces have warping, micro irregularities, or the like. Hence, the surface(s) of the resin member(s) and the surface(s) of the metal plate(s) used in the connector may actually create gaps due to the warping or irregularities even in the areas where they were to be in contact with each other. Accordingly, the state where the right side surface 22C and the right inner surface 35C are in contact with each other includes a state where there is a slight or a partial gap between the right side surface 22C and the right inner surface 35C. To put it differently, the "contact region" of the present specification also includes regions where there is such a gap caused by warping and/or irregularities. Even in a case where there is such a gap, the gap between the right side surface 22C and the right inner surface 35C in the contact region is smaller than the gap between the right side surface 22C and the right inner surface 35C in the gap region.

In a case where the potting material N passes through the gap between the right inner surface 35C and the right side surface 22C, the potting material N remains in the reservoir space S2. Hence, it is possible to prevent the potting material N from entering the mating space S1. In addition, the recess formed in the right inside surface 35C of the first housing 30 is used for securing the reservoir space S2. Hence, the structure can easily increase the capacity of the reservoir space S2 from the corresponding capacity of, for example, a structure where only the recess 22*g* formed in the right side surface 22C of the first terminal 20 (see FIG. 6B) is used for securing the reservoir space S2.

In one exemplar use of the first connector 10, the position of the bottom portion (see FIG. 6B) of the reservoir surface 35*b* of the reservoir space S2 is lower than the liquid-surface level of the potting material N (see FIG. 7). In addition, the entire reservoir space S2 is positioned at a lower level than the liquid-surface level of the potting material N. The top portion of the reservoir space S2 (i.e., the top edge of the gap region R2) may be higher than the liquid-surface level of the potting material N.

As illustrated in FIG. 6B, in the example of the first connector 10, the reservoir space S2 is open upward. To put it differently, the reservoir space S2 is open toward the side of the mating portion 21. To put it still differently, no contact region R1 is formed on the upper side of the reservoir space S2. This structure allows the reservoir space S2 to have a larger capacity. In addition, even in a case where, for example, the potting material N reaches the mating space S1 by passing through the gap between the front surface 22A and the inner surface of the terminal holding hole 35a and/or through the gap between the rear surface 22B and the inner surface of the terminal holding hole 35a, the potting material N can be detained in the reservoir space S2.

In a case where a surface of a plated terminal is brought into close contact with an inner surface of a terminal holding hole, crystals of the plating-material metal grow into needle shapes. This grown crystal (whiskers) is more likely to be produced as the area of the contact region R1 increases. In the example of the first connector 10, the absence of the contact region R1 on the upper side of the reservoir space S2 reduces the area of the contact region R1 and thus reduces also the occurrence of whiskers.

In the example of the first connector 10, the contact region R1 is substantially U-shaped. To put it differently, as illustrated in FIG. 8, the contact region R1 includes: a partial region R1a positioned below the gap region R2, and a partial region R1b positioned on the front side of the gap region R2; a partial region R1c positioned on the rear side of the gap region R2 (the partial region R1a corresponds to the "first partial region" of the Claims; and the partial regions R1b and R1c correspond to the "second partial region" of the Claims). To put it differently, the gap region R2 (i.e., the reservoir space S2) is surrounded by the contact region R1. Such a configuration can effectively prevent the potting material N from entering the mating space S1. Note that: a front-side portion of the above-described reservoir surface 35b is formed between the gap region R2 and the partial region R1b positioned on the front side; a rear-side portion of the above-described reservoir surface 35b is formed between the gap region R2 and the partial region R1c positioned on the rear side; and a bottom portion of the reservoir surface 35b is formed between the gap region R2 and the partial region R1a positioned on the lower side. To put it differently, the reservoir space S2 has an outer peripheral surface defined by the reservoir surface 35b.

In the example of the first connector 10, the width of the gap region R2 measured in the vertical direction is substantially equal to the width of the partial region R1a measured in the vertical direction, that is, the corresponding width of the lower-side part of the contact region R1. In addition, the width of the gap region R2 measured in the front-to-rear direction is substantially equal to the width, measured in the front-to-rear direction, of the partial region R1b, that is, the front-side part of the contact region R1, and to the corresponding width of the partial region R1c, that is, the rear-side part of the contact region R1. The size of the gap region R2 is not limited to that of the example of the first connector 10. To put it differently, the width of the gap region R2 measured in the vertical direction may be smaller than or larger than the corresponding width of the partial region R1a, that is, the lower-side part of the contact region R1. In addition, the width of the gap region R2 measured in the front-to-rear direction may be smaller than or larger than the corresponding width of each of the partial regions R1b and R1c of the contact region R1.

As illustrated in FIG. 8, the contact portions 22c formed on the front surface 22A and the rear surface 22B of the to-be-held portion 22 are positioned at the level of the partial region R1a. The engaging portions 22a formed on the front surface 22A and on the rear surface 22B of the to-be-held portion 22 are located at the level of the partial region R1b, the partial region R1c, and the gap region R2.

The structure including the right inner surface 35C of the terminal holding hole 35a and the right side surface 22C of the to-be-held portion 22 may be as follows. (i) For example, another contact region R1 may be formed on the upper side of the reservoir space S2 (i.e., the gap region R2). To put it differently, the reservoir space S2 may be surrounded by the contact regions R1 over the entire circumference thereof (ii) As another example, the contact region R1 does not have to include at least one of the front-side partial region R1b and the rear-side partial region R1c. For example, the contact region R1 may include the front-side partial region R1b, but does not have to include the rear-side partial region R1c. Conversely, the contact region R1 may include the rear-side partial region R1c, but does not have to include the front-side partial region R1b. As yet another example, the contact region R1 may not have both of the partial regions R1b and R1c. To put it differently, the gap region R2 (i.e., the reservoir space S2) may stretch from the front end to the rear end of the right side surface 22C of the to-be-held portion 22. In these cases, the contact region R1 may have an additional portion located above the reservoir space S2 (i.e., the gap region R2). (iii) As illustrated in FIGS. 4A and 8, the right side surface 22C of the first terminal 20 may include the recess 22g located in the gap region R2 and configured to secure the reservoir space S2. In this case, unlike the example of the first connector 10, the right inner surface 35C of the terminal holding holes 35a may be devoid of the recess that is configured to serve as a part of the reservoir space S2. In the example of the first connector 10, the recess 22g can increase the capacity of the reservoir space. In addition, while the first terminal 20 is being inserted into the terminal holding hole 35a, the recess 22g helps preventing the plated metal from coming off from the surface of the first terminal 20 (in particular, from the inner surface of the recess 22g). Unlike the example of the first connector 10, the right side surface 22C of the terminal holding portion 22 does not have to include such a recess 22g.

As illustrated in FIG. 6B, the recess 22g includes: a side surface 22h facing the inner surface 35C of the terminal holding hole 35a; and a bottom surface 22i located on the lower side (i.e., on the exposed portion 23 side) of the side surface 22h. On the other hand, as described earlier, the recess defining the space S2 is formed in the inner surface 35C of the terminal holding hole 35a. This recess includes: a surface 35d facing the outer surface of the to-be-held portion 22; and a surface (i.e., the bottom portion of the reservoir surface 35b) located on the lower side (i.e., on the exposed portion 23 side) of the surface 35d. The bottom surface 22i of the recess 22g and the bottom portion of the reservoir surface 35b (i.e., the lowest portion in the reservoir surface) are positioned at different levels from each other in the vertical direction. In the example of the first connector 10, the bottom surface 22i of the recess 22g is positioned at a higher level than the level of the bottom portion of the reservoir surface 35b. To put it differently, the bottom surface 22i of the recess 22g is positioned on the mating portion 21 side, of the bottom portion of the reservoir portion 35b. According to such a structure of the recess 22g, even in a case where the first terminal 20 is not sufficiently inserted into the terminal holding hole 35a, that is, even in a case where the position of the first terminal 20 is lower than the correct position, a sufficient area of the contact region R1 can be secured. In addition, the corner of each of the bottom surfaces 22i (i.e., the boundary between the bottom surface 22i and the right side surface 22C) helps preventing the potting material from rising along the right side surface 22C of the first terminal 20. Unlike the example of the first connector 10, the bottom surface 22i of the recess 22g may be positioned at the same level as the bottom portion of the reservoir surface 35b, or may be positioned at a lower level than the bottom portion of the reservoir surface 35b. In a case where the bottom surface 22i of the recess 22g is lower than the bottom portion of the reservoir surface 35b, the capacity of the reservoir space S2 can be further increased from the corresponding capacity of a case where the bottom surface 22i is higher than the bottom portion of the reservoir surface 35b. In still another example, the bottom surface 22i is an inclined surface in the example of the first connector 10, but may also be a horizontal surface.

In the example of the first connector 10, as illustrated in FIG. 4A, the recess 22g has boundaries 22j: one of which is a boundary between the right side surface 22C (specifically, the portion of the right side 22C surrounding the recess 22g) and the surface located on the front side of the side surface 22h; and the other one is a boundary between the right side surface 22C and the surface located on the rear side of the side surface 22h. The boundaries 22j correspond to the positions of inner surfaces 35c (see FIG. 5A) located on the front side and on the rear side of the recess formed in the terminal holding hole 35a (i.e., the recess configured to secure the reservoir space S2). Unlike the example of the first connector 10, each of the boundaries 22j may be located at an inner position relative to the corresponding one of the inner surfaces 35c located on the front side and on the rear side of the recess configured to secure the reservoir space S2. Note that in the example of the first connector 10, the surfaces located on the front side and the rear side of the side surface 22h are inclined surfaces, but those surfaces may be horizontal surfaces.

In the example of the first connector 10, the left inner surface 35D of the terminal holding hole 35a and the left side surface 22D of the to-be-held portion 22 have identical structures respectively to the structures of the right inner surface 35C and the right side surface 22C described earlier. To put it differently, the reservoir space S2, the contact region R1, the gap region R2, and the reservoir surface 35b are formed in the left inner surface 35D of the terminal holding hole 35a and the left side surface 22D of the to-be-held portion 22.

Unlike the example of the first connector 10, the left inner surface 35D of the terminal holding hole 35a and the left side surface 22D of the to-be-held portion 22 may have a different structure from that of the right inner surface 35C of the terminal holding hole 35a and the right side surface 22C of the to-be-held portion 22. For example, the left inner surface 35D and left side surface 22D do not have to have the gap region R2 (i.e., the reservoir space S2). To put it differently, the entire left inner surface 35D and the entire left side surface 22D may be in contact with each other.

As illustrated in FIGS. 5A and 6B, the top surface 35m of the bottom portion 35 has a surface 35m1 located between two mutually-adjacent terminal holding holes 35a. Hereinafter, this surface 35m1 is referred to as a "reference surface." The top surface 35m has a surface 35m2 on the upper edge of the terminal holding hole 35a. Hereinafter, this surface 35m2 is referred to as a "hole-edge surface." The top surface 35m of the bottom portion 35 declines toward the upper edge of the terminal holding hole 35a. The top surface 35m corresponds to the "surface of the terminal holding portion" in the Claims. In the example of the first connector 10, the hole-edge surface 35m2 is positioned at a lower level than the reference surface 35m1.

Specifically, the hole-edge surface 35m2 declines toward the to-be-held portion 22. The hole-edge surface 35m2 is formed so as to surround the to-be-held portion 22 of the terminal 20. The hole-edge surface 35m2 may be formed to surround entirely the to-be-held portion 22. Alternatively, the hole-edge surface 35m2 may be formed only in a section in the circumferential direction of the to-be-held portion 22 (e.g., a section along the right side surface 22C and/or the left side surface 22D of the to-be-held portion 22).

Even in a case where the potting material N passes through the gap between the outer surface of the to-be-held portion 22 and the inner surface of the terminal holding hole 35a, the hole-edge surface 35m2 can detain the potting material N on the upper side of the hole-edge surface 35m2. As illustrated in FIG. 8, when the second terminal 92 is inserted into the mating space S1, the position of the end part of the second terminal 92 is restricted by the reference surface 35m1. Hence, even in a case where the second terminal 92 of the second connector 90 is disposed in the mating space S1, a gap is secured between the hole-edge surface 35m2 and the bottom end of the second terminal 92. Hence, it is possible to prevent the potting material N detained on the upper side of the hole-edge surface 35m2 from interfering with the bottom end of the second terminal 92. Note that the structure of the top surface 35m of the bottom portion 35 is not limited to that of the example of the first connector 10. For example, the top surface 35m of the bottom portion 35 may be curved down toward the top edge of the terminal holding hole 35a. In this case, there may be no clearly defined boundary between the reference surface 35m1 and the hole-edge surface 35m2. In addition, the size of the hole-edge surface 35m2 is not limited to that illustrated in FIG. 6B and the like.

As described earlier, the reservoir spaces S2 formed on the right side and on the left side of the to-be-held portion 22 are open upward. In the example of the first connector 10, the hole-edge surface 35m2 is connected to the reservoir surface 35b that defines the space S2. Hence, the potting material flowing onto the hole-edge surface 35m2 can flow toward the space S2 and/or return to the space S2. In addition, even in a case where the potting material flows out of the space S2, the potting material can be received by the hole-edge surface 35m2. Note that, as illustrated in FIG. 8, the position, in the vertical direction, of the bottom portion of the reservoir surface 35b is lower than the position, in the vertical direction, of the engaging portions 22a and 22b. Hence, a sufficient capacity of the reservoir space S2 can be secured. In addition, the width W3 of the reservoir space S2 measured in the left-and-right direction (see FIG. 6B) is greater than one-fourth of the thickness of the to-be-held portion 22 of the terminal 20 measured in the left-and-right direction. To put it differently, the total of the widths W3 of the two reservoir spaces S2, one of which is formed on the right-hand side of the terminal 20 and the other one of which is formed on the left-hand side of the terminal 20, is greater than half the thickness of the to-be-held portion 22 measured in the left-and-right direction.

Note that the structure of the bottom portion 35 is not limited to that of the example of the first connector 10. For example, the hole-edge surface 35m2 may be a horizontal surface. To put it differently, the hole-edge surface 35m2 may be a surface that is positioned at a lower level than the reference plane 35m1 and that is parallel to the circuit board M. In still another example, the bottom surface 35 does not have to have the hole-edge surface 35m2.

As illustrated in FIG. 6B, a slope 35p that surrounds the to-be-held portion 22 is also formed on a lower edge of the terminal holding hole 35a. This slope 35p guides the first terminal 20 to the inside of the terminal holding hole 35a while the first terminal 20 is being inserted into the terminal holding hole 35a.

As illustrated in FIG. 4A, the width (thickness) of the mating portion 21 of the first terminal 20 is smaller than the width (thickness) of the to-be-held portion 22. In the example of the first connector 10, the width of the engaging portion 21 measured in the front-to-rear direction is smaller than the width of the to-be-held portion 22 measured in the front-to-rear direction. In addition, the width (thickness) of the mating portion 21 measured in the left-and-right direction is smaller than the width (thickness) of the to-be-held portion 22 measured in the left-and-right direction. Thus, as illustrated in FIG. 4A and FIG. 8, the first terminal 20 has slopes 24a and 24c at the boundary between the outer surface of the to-be-held portion 22 and the outer surface of the engaging portion 21. The slopes 24a and 24c are formed at lower positions than the reference surface 35m1 of the top surface 35m of the bottom portion 35. Only a part of the slopes 24a and 24c may be at lower positions than the reference plane 35m1 of the bottom 35 of the first housing 30 (see FIG. 6B).

Even in a case where the potting material N passes through the gap between the outer surface of the to-be-held portion 22 and the inner surface of the terminal holding hole 35a, the structure of the slopes 24a and 24c can detain the potting material N on the upper side of the slopes 24a and 24c. The slopes 24a and 24c are at lower levels than the top surface 35m (reference surface 35m1) of the bottom portion 35 of the first housing 30. Hence, even in a case where the second terminal 92 of the second connector 90 is disposed in the mating space S1 as illustrated in FIG. 7, a gap is secured between the lower end of the second terminal 92 and each of the slopes 24a and 24c. Hence, it is possible to prevent the potting material N detained on the upper side of the slopes 24a and 24c from interfering with the bottom end of the second terminal 92.

In the example of the first connector 10, one slope 24a is formed between the front surface of the engaging part 21 and the front surface 22A of the to-be-held portion 22, whereas another slope 24a is formed between the rear surface of the mating portion 21 and the rear surface 22B of the to-be-held portion 22. In addition, one slope 24c is formed between the right side surface of the mating portion 21 and the right side surface 22C of the to-be-held portion 22, whereas another slope 24c is formed between the left side surface of the mating portion 21 and the left side surface 22D of the to-be-held portion 22. These slopes 24a and 24c are positioned at approximately the same level as the level of the hole-edge surface 35m2 described above. To put it differently, at least a portion of the hole-edge surface 35m2 is positioned at the same level in the vertical direction as the slopes 24a and 24c. Such slopes 24a and 24c allow the hole-edge surface 35m2 and the slopes 24a and 24c to detain the potting material N without causing interference between the potting material N and the second terminal 92.

Note that the structure of the first terminal 20 is not limited to that of the example of the first connector 10. For example, the slopes 24a and 24c may be formed only on some part of the outer peripheral surfaces of the first terminal 20. For example, the slope 24a is formed on the front surface and on the rear surface of the first terminal 20, while the slope 24c does not have to be formed on the right side surface and on the left side surface of the first terminal 20. Conversely, the slope 24c is formed on the right side surface and the left side surface of the first terminal 20, while the slope 24a does not have to be formed on the front surface or on the rear surface of the first terminal 20. As yet another example, the first terminal 20 does not have to have any of the slopes 24a and 24c.

As described above, the engaging portions 22a and 22b are formed on the front surface 22A and the rear surface 22B of the to-be-held portion 22, respectively. As illustrated in FIG. 4A, a slope 22e is formed on the upper side of the engaging portion 22e. Likewise, a slope 22f is formed on the upper side of the engaging portion 22b. In a state where the to-be-held portion 22 is in the terminal holding hole 35a, gaps are secured between the inner surface of the terminal holding hole 35a and the individual ones of the slopes 22e and 22f. Hence, these gaps can also detain the potting material N.

As illustrated in FIG. 7, the mating space S1 has a space located on the front side of the mating portion 21 of the first terminal 20 and allowing the entry of the second terminal 92. The first terminal 20 has a portion configured to be contact with the inner surface of the mating space S1 (the inner surface of the rear wall 31 of the first housing 30). The portion is located on the opposite side of the mating portion 21 to the space that the second terminal 92 enters, that is, on the rear side of the mating portion 21. Specifically, the mating portion 21 has a protrusion 21b located on the rear side of the mating portion 21. The protrusion 21b protrudes rearward and contacts the inner surface of the mating space S1. Such a configuration can prevent the first terminal 20 from moving rearward when the second terminal 92 is inserted in the mating space S1. The rear wall 31 of the first housing 30 includes a protrusion 31b positioned above the protrusion 21b. This protrusion 31b can prevent a collision between the second terminal 92 and the first terminal 10 when the second terminal 92 is inserted into the first connector 10.

As illustrated in FIG. 4A, the mating portion 21 includes a surface 21c located under the protrusion 21b. The surface 21c is separated forward from the inner surface of the mating space S1 (i.e., the inner surface of the rear wall 31 of the first housing 30). To put it differently, a recess is formed under the protrusion 21b. Such a shape of the mating portion 21 can prevent the infiltration of the potting material N more effectively. For example, in a case where the rear surface of the mating portion 21 and the inner surface of the mating space S1 are in contact with each other, or in a case where there is only a small gap between the rear surface of the mating portion 21 and the inner surface of the mating space S1, the potting material N may possibly infiltrate, by capillary action, between the corner of the rear surface of the mating portion 21 and the corner of a groove 31a (see FIGS. 5A and 5B) where the mating portion 21 is disposed. The above-described surface 21c of the first connector 10 can prevent such infiltration of the potting material N.

As illustrated in FIG. 7, the first housing 30 includes a locking portion 32a formed on the front surface of the front wall 32 of the first housing 30. The second housing 93 includes a movable portion 94 that includes a locking tab 94a configured to be hooked on the locking portion 32a. The movable portion 94 is formed to allow the locking tab 94a to move back and forth. Once the locking tab 94a is hooked on the locking portion 32a, the second connector 90 and the first connector 10 cannot be separated from each other.

The first housing 30 includes a lock cover 36 located on the front side of the front wall 32. The lock cover 36 is configured to accommodate the locking portion 32a and is capable of accepting the insertion of the movable part 94 of the second connector 90. The lock cover 36 is open upward and covers the front side, the bottom side, the right-hand side, and the left-hand side of the locking portion 32a and the movable portion 94. The lock cover 36 can prevent the locking tab 94a and the locking portion 32a from being soaked in the potting material N (see FIG. 7).

As illustrated in FIG. 1, the first connector 10 includes reinforcing metal fittings 41. The reinforcing metal fittings 41 are attached to the right side surface and the left side surface of the first housing 30, for example Each of the right side surface and the left side surface of the first housing 30 includes a reinforcing-metal-fitting attaching portion 37 configured to cover the corresponding reinforcing metal fitting 41. The lower end of each reinforcing metal fitting 41 (i.e., the portion that is to be attached to the circuit board M) is exposed downward from the reinforcing-metal-fitting attaching portion 37. The reinforcing-metal-fitting attaching portion 37 covers the outer side in the left-and-right direction of the reinforcing metal fitting 41, and also covers the front side and the rear side of the reinforcing metal fitting 41. This structure cannot prevent the bottom end of the reinforcing metal fitting 41 from being soaked in the potting material N, but can prevent the rest of the reinforcing metal fitting 41 from being soaked in the potting material N. To use the first connector 10, the reinforcing metal fittings 41 are soldered to the circuit board M, for example.

As described above, the terminal holding hole 35a is formed in the bottom portion (terminal holding portion) 35 of the first housing 30 so as to pass through the bottom portion (terminal holding portion) 35 in the vertical direction. The first terminal 20 includes: the to-be-held portion 22 configured to be inserted, in the vertical direction, into the terminal holding hole 35a; the mating portion 21 that sticks out from the terminal holding hole 35a and that includes a contact point 21a configured to contact the second terminal 92; and the exposed portion 23 sticking out from the opposite side of the terminal holding hole 35a to the side from which the mating portion 21 sticks out and including the to-be-attached portion 23a configured to be attached to the circuit board M. The outer surface of the to-be-held portion 22 and the inner surface of the terminal holding hole 35a include: the contact region R1 where the outer surface of the to-be-held portion 22 and the inner surface of the terminal holding hole 35a are in contact with each other; and the gap region R2 where the reservoir space S2 is formed between the outer surface of the to-be-held portion 22 and the inner surface of the terminal holding hole 35a. The contact region R1 includes the partial region R1a that is located on the exposed portion 23 side, in the vertical direction, of the gap region R2. Such a configuration can prevent the potting material from infiltrating into the inside of the first housing 30.

The connector and the connector assembly proposed in the present disclosure are not limited to the first connector 10 and the connector assembly 1 described so far, but can have various variations.

For example, as described earlier, the first connector 10 and the second connector 90 may be capable of being mated together in a direction parallel to the circuit board M.

In an alternative example, the first terminal 10 may be fixed to the first housing 30 by an insert molding method. To put it differently, during the molding process of the first housing 30, the first terminal 10 may be disposed inside the mold and then, the material of the first housing 30 may be supplied to the inside of the mold. In this case, the first terminal 10 does not have to include the above-described engaging portions 22a and 22b.

In addition, the first terminal 10 is not limited to a terminal formed by punching from a metal plate. For example, the first terminal 10 may be a cylindrical terminal. In this case, the first terminal 10 may be formed by casting.

In addition, a product having a gap between the outer surface of the first terminal 10 and the inner surface of the terminal holding hole 35a in some or in the entire part of the contact region R1 due to the tolerance of the first terminal 10 and the first housing 30 is also within the scope of the connector proposed in the present disclosure. For example, in each of the contact regions R1 of some of the plurality of first terminals 10, a gap may be formed between the outer surface of the first terminal 10 and the inner surface of the terminal holding hole 35a due to the tolerance of the first housing 30 and the like.

The invention claimed is:
1. A connector comprising:
a housing having, a terminal holding hole formed therein, the terminal holding hole being a hole that penetrates the housing in a first direction, and
a terminal disposed in the terminal holding hole, wherein:
the terminal includes:
a to-be-held portion positioned in the terminal holding hole and held inside the terminal holding hole,
a first portion sticking out from the terminal holding hole and including a contact point configured to contact a counterpart terminal, and
a second portion sticking out from the terminal holding hole on a side opposite to the first portion and including a to-be-attached portion configured to be attached to a circuit board,
an outer surface of the to-be-held portion and an inner surface of the terminal holding hole include:
a contact region where the outer surface of the to-be-held portion and the inner surface of the terminal holding hole are in contact with each other, and
a gap region where a space is formed between the outer surface of the to-be-held Portion and the inner surface of the terminal holding hole, and
the contact region includes a first partial region located on the second portion's side, in the first direction, of the gap region,
wherein:
the space is open toward the second portion,
a first recess is formed in the inner surface of the terminal holding hole,
the first recess is located in the gap region and forms the space,
a second recess is formed in the outer surface of the to-be-held portion, and
the second recess is located in the gap region and forms the space.
2. The connector according to claim 1, wherein:
the first recess includes:
a first surface facing the outer surface of the to-be-held portion, and
a first bottom surface located on the second portion's side of the first surface,
the second recess includes:
a second surface facing the inner surface of the terminal holding hole, and
a second bottom surface located on the second portion's side of the second surface, and
the second bottom surface and the first bottom surface are positioned at different levels in the first direction from each other.

3. The connector according to claim 1, wherein:
the housing includes a terminal holding portion in which the terminal holding hole is formed,
the terminal holding portion includes a surface facing the first portion, and
the surface of the terminal holding portion declines to an edge of the terminal holding hole.

4. The connector according to claim 1, wherein the contact region further includes a second partial region located at a position in a second direction from the gap region, the second direction being orthogonal to the first direction and being along the outer surface of the to-be-held portion.

5. The connector according to claim 4, wherein:
the contact region includes, as the second portion region:
a region located on a first side, in the second direction, of the gap region, and
a region located on an opposite side of the gap region to the first side.

6. A connector assembly comprising:
a first connector that is a connector of claim 1, and
a second connector including a terminal configured to contact the terminal of the first connector.

7. A circuit device comprising:
a connector according to claim 1, and
the circuit board,
wherein the connector is mounted on the circuit board, and
a potting material is applied to the circuit board.

8. A connector comprising:
a housing having, a terminal holding hole formed therein, the terminal holding hole being a hole that penetrates the housing in a first direction, and
a terminal disposed in the terminal holding hole, wherein:
the terminal includes:
a to-be-held portion positioned in the terminal holding hole and held inside the terminal holding hole,
a first portion sticking out from the terminal holding hole and including a contact point configured to contact a counterpart terminal, and
a second portion sticking, out from the terminal holding hole on a side opposite to the first portion and including a to-be-attached portion configured to be attached to a circuit board,
an outer surface of the to-be-held portion and an inner surface of the terminal holding hole include:
a contact region where the outer surface of the to-be-held portion and the inner surface of the terminal holding hole are in contact with each other, and
a gap region where a space is formed between the outer surface of the to-be-held portion and the inner surface of the terminal holding hole, and
the contact region includes a first partial region located on the second portion's side, in the first direction, of the gap region,
wherein:
the outer surface of the to-be-held portion includes:
a first outer surface facing in a second direction that is orthogonal to the first direction and that is a direction along the outer surface of the to-be-held portion, and
a second outer surface facing in a third direction that is orthogonal to the first direction and to the second direction,
the inner surface of the terminal holding hole includes:
a first inner surface facing the first outer surface, and
a second inner surface facing the second outer surface,
the first outer surface includes an engaging portion formed therein and configured to be hooked on the first inner surface, and
the second outer surface and the second inner surface include:
the gap region, and
the first partial region of the contact region.

9. A connector assembly comprising:
a first connector that is a connector of claim 8, and
a second connector including a terminal configured to contact the terminal of the first connector.

10. A circuit device comprising:
a connector according to claim 8, and
the circuit board,
wherein the connector is mounted on the circuit board, and
a potting material is applied to the circuit board.

11. The connector according to claim 8, wherein the contact region further includes a second partial region located at a position in a second direction from the gap region, the second direction being orthogonal to the first direction and being along the outer surface of the to-be-held portion.

12. The connector according to claim 11, wherein:
the contact region includes, as the second portion region:
a region located on a first side, in the second direction, of the gap region, and
a region located on an opposite side of the gap region to the first side.

13. The connector according to claim 8, wherein the space is open toward the second portion.

14. The connector according to claim 13, wherein:
a first recess is formed in the inner surface of the terminal holding hole, and
the first recess is located in the gap region and forms the space.

15. The connector according to claim 8, wherein:
the housing includes a terminal holding portion in which the terminal holding hole is formed,
the terminal holding portion includes a surface facing the first portion, and
the surface of the terminal holding portion declines to an edge of the terminal holding hole.

* * * * *